(12) United States Patent
Winterhalter et al.

(10) Patent No.: US 8,121,752 B2
(45) Date of Patent: Feb. 21, 2012

(54) CRASH SURVIVABLE MEMORY UNIT

(75) Inventors: Michael Winterhalter, Nokomis, FL (US); Endre Berecz, Bradenton, FL (US)

(73) Assignee: L-3 Communications Coporation, New York, NY (US)

( * ) Notice: Subject to any disclaimer, the term of this patent is extended or adjusted under 35 U.S.C. 154(b) by 958 days.

(21) Appl. No.: 12/117,473

(22) Filed: May 8, 2008

(65) Prior Publication Data

US 2009/0277683 A1 Nov. 12, 2009

(51) Int. Cl.
*G01M 17/00* (2006.01)
(52) U.S. Cl. ............... 701/35; 701/14; 701/15; 701/29; 174/544; 206/305; 206/521; 361/790; 361/803; 361/804
(58) Field of Classification Search .................. 701/14, 701/29, 35; 455/66.1, 67.13, 67.16, 67.11; 342/36; 439/69, 76.1
See application file for complete search history.

(56) References Cited

U.S. PATENT DOCUMENTS

| | | | |
|---|---|---|---|
| 4,574,454 A | 3/1986 | Dyson | |
| 4,893,397 A | 1/1990 | Hughes | |
| 6,153,720 A | 11/2000 | Olzak et al. | |
| 7,208,685 B2 | 4/2007 | Browning et al. | |
| 2002/0144834 A1 | 10/2002 | Purdom | |

FOREIGN PATENT DOCUMENTS

EP 1746238 A2 1/2007

*Primary Examiner* — Thomas Black
*Assistant Examiner* — Luke Huynh
(74) *Attorney, Agent, or Firm* — Fox Rothschild, LLP; Robert J. Sacco (57) ABSTRACT

A flight recorder includes an information input device, heat sensitive memory device electrically connected to the information input device, and housing enclosing the heat sensitive memory device. The housing is made with a first material and having a plurality of openings made through the housing. A sacrificial material is disposed between the housing and heat sensitive memory device. The sacrificial material having a lower melting temperature than the first material such that the sacrificial material changes state and egresses through the openings in the housing when exposed to heat to create an air gap between the housing and heat sensitive memory device. The first material includes nickel and the sacrificial material includes aluminum. A heat insulating layer is disposed between the sacrificial material and heat sensitive memory device. A second sacrificial material is disposed between the heat insulating layer and heat sensitive memory device.

18 Claims, 6 Drawing Sheets

CRASH SURVIVABLE MEMORY UNIT

FIELD OF THE INVENTION

The present invention relates in general to a crash-survivable memory unit for a transportation recorder and, more particularly, for an improved method and apparatus for a crash survivable memory unit providing high temperature thermal protection.

BACKGROUND OF THE INVENTION

In many airline accidents, or other aircraft accidents, the only systems that survive in a usable form are the crash survivable memory units (CSMUs) of the flight data recorders (FDRs), cockpit voice recorders (CVRs) and sometimes a flight video recorder. The flight data recorder is a flight recorder used to record specific aircraft performance parameters, such as air speed, altitude, vertical acceleration, time, magnetic heading, control-column position, rudder-pedal position, control-wheel position, horizontal stabilizer, and fuel flow. The cockpit voice recorder records cockpit voices, and possibly other sounds throughout the aircraft, such as conversations between the pilot, ground control, copilot and other flight crew. The FDR, CVR and flight video recorder are generically known as flight recorders. The FDR and CVR can be separate units, although some versions combine both in one unit.

Popularly known as the black box used for aircraft mishap or accident analysis, these units are also used to study air safety issues, material degradation, unsafe flying procedures, and jet engine performance. These International Civil Aviation Organization (ICAO) regulated black box devices are often used as an aid in investigating aircraft mishaps, and its recovery is typically second only in importance to the recovery of any surviving passengers/crew, and victims' bodies. The outer housing of the device can be painted bright orange and is generally located in the tail section of the aircraft, as this location allows the forward section of the aircraft to be a crush zone providing some crush protection for the flight records in the event of a typical crash or collision.

In the event of a crash, the rest of the flight recorders' chassis and inner components are typically mangled, as are other aircraft components. The CSMU is a large cylinder that bolts onto the flat portion of the recorder. The CSMU device is engineered to withstand extreme heat, violent crashes, and intense pressure. In older magnetic-tape recorders, the CSMU can be inside a rectangular box.

The flight recorders are placed in an aircraft, at least in part, for the purpose of facilitating the investigation of an aircraft accident or incident. Consequently, flight recorders can be specified to be capable of surviving the conditions likely to be encountered in a severe aircraft accident. The flight recorder can be specified to withstand an impact of 3600 g and temperatures of over 1000° C., as required by EUROCAE ED-112.

The CSMU of known flight recorders can use three layers of materials to insulate and protect the stack of memory boards that store the digitized flight, voice, and video information. The materials that provide a barrier protection for the memory boards, starting at the innermost barrier and working outward are: a) an aluminum housing which can be a thin layer of aluminum around the stack of memory cards; b) high-temperature insulation which can be dry-silica material approximately 1 inch (2.54 cm) thick and which provides high-temperature thermal protection during post-accident fires, and c) a stainless-steel shell that is about 0.18-0.25 inches (0.64 cm) thick. Titanium can be used to create the outer armor.

In addition to the above requirements/methods which are generally applicable to commercial aircraft, standards are being developed for crash survivable memory units which are used in general aviation, and other standards exist and are being developed for military aircraft. These other methods and developing standards require innovation in the area of thermal protection for the CSMU, because the standards may require different tradeoffs and the general aviation market may require a lower cost unit when compared to the commercial aviation or military markets. Further, CSMUs can be required or envisioned in various other transportation systems, such as marine, train, truck, cars, and motorcycles.

Although existing methods do provide some thermal protection to the CSMU, there still exists a need to continually advance and improve the thermal protection characteristics of CSMUs in order to protect the vital flight data, flight voice, and flight video recorded therein.

SUMMARY OF THE INVENTION

In one embodiment, the present invention is a crash survivable memory unit comprising a heat sensitive memory device and a housing enclosing the heat sensitive memory device. The housing is made with a first material and has a plurality of openings made through the housing. A sacrificial material is disposed between the housing and heat sensitive memory device. The sacrificial material has a lower melting temperature than the first material such that the sacrificial material changes state and egresses through the openings in the housing when exposed to heat to create an air gap between the housing and heat sensitive memory device.

In another embodiment, the present invention is a flight recorder comprising a information input device and a heat sensitive memory device electrically connected to the information input device. A housing encloses the heat sensitive memory device. The housing is made with a first material and having a plurality of openings made through the housing. A sacrificial material is disposed between the housing and heat sensitive memory device. The sacrificial material has a lower melting temperature than the first material such that the sacrificial material changes state and egresses through the openings in the housing when exposed to heat to create an air gap between the housing and heat sensitive memory device.

In another embodiment, the present invention is an aircraft comprising an airframe and a flight recorder connected to the airframe. The flight recorder includes an information input device, a heat sensitive memory device electrically connected to the information input device, a housing enclosing the heat sensitive memory device, the housing being made with a first material and having a plurality of openings made through the housing, and a sacrificial material disposed between the housing and heat sensitive memory device. The sacrificial material has a lower melting temperature than the first material such that the sacrificial material changes state and egresses through the openings in the housing when exposed to heat to create an air gap between the housing and heat sensitive memory device.

In another embodiment, the present invention is a method of making a crash survivable memory unit comprising the steps of providing a heat sensitive memory device, enclosing the heat sensitive memory device in a housing, the housing being made with a first material and having a plurality of openings made through the housing, and disposing a sacrificial material between the housing and heat sensitive memory device. The sacrificial material has a lower melting temperature than the first material such that the sacrificial material changes state and egresses through the openings in the housing when exposed to heat to create an air gap between the housing and heat sensitive memory device.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
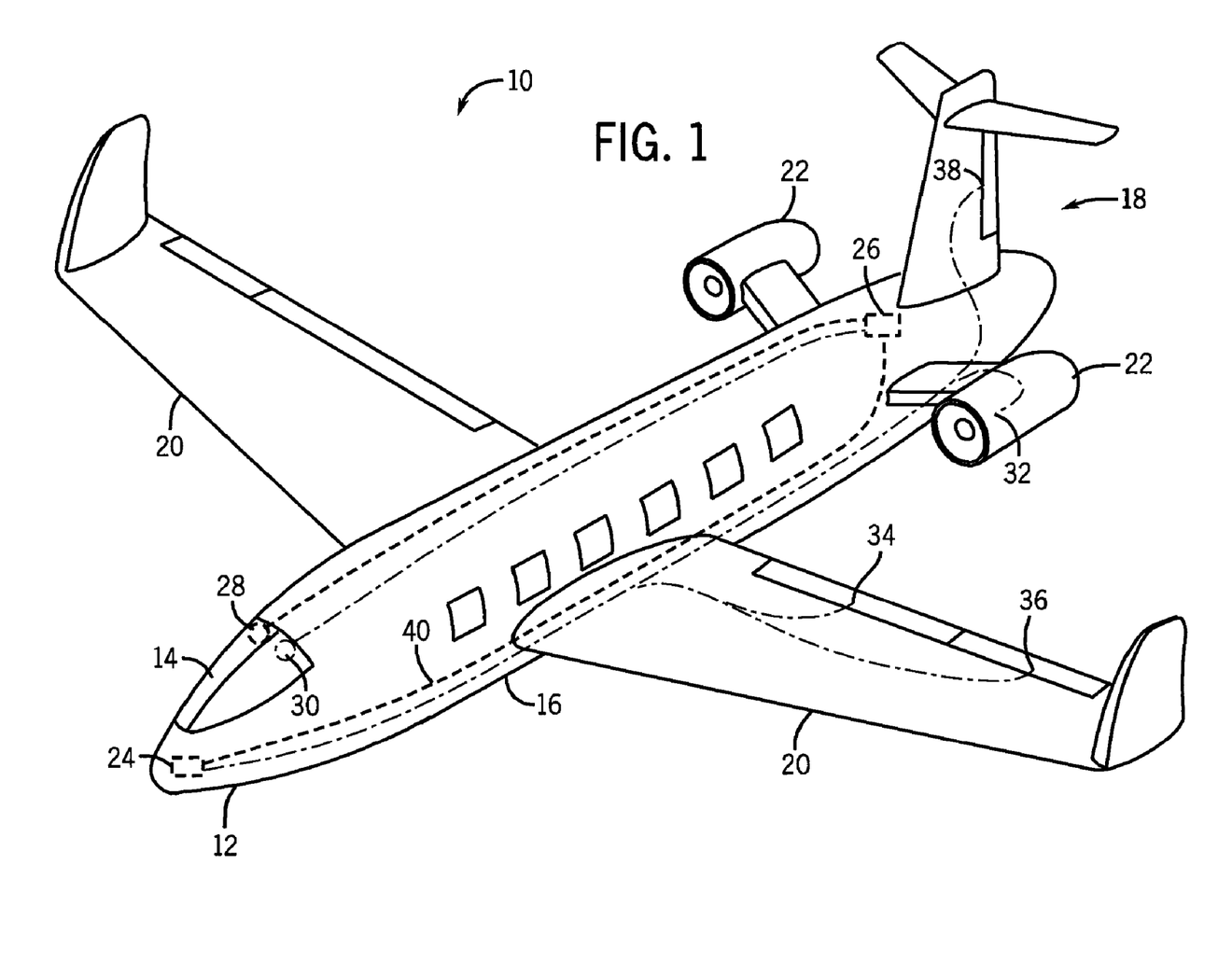
FIG. 1 is a perspective view of an aircraft with a flight recorder having a CSMU.

Referring now to the drawings, and more particularly to FIG. 1, there is shown aircraft 10 which generally includes a nose section 12, cockpit 14, fuselage 16, tail section 18, wings 20, and engines 22. As is known, fuselage 16 includes an airframe with many components. A flight data acquisition unit 24 can be positioned in nose 12, or other locations, to acquire flight information such as air speed, altitude, vertical acceleration, time, magnetic heading, control-column position, rudder-pedal position, control-wheel position, wing flap position, horizontal stabilizer, fuel flow, and landing gear position, from corresponding sensors throughout aircraft 10. Flight data acquisition unit 24 can be connected to flight recorder 26, which can be connected to microphone 28, or other types of sound sensors, for the recording of sound data such as crew and passenger conversations. Similarly, flight recorder 26 can be connected to camera 30, or other types of video sensors, for the recording of video data such as crew and passenger actions. Although microphone 28 and camera 30 are shown as being positioned in cockpit 14, each can alternatively be located in a variety of positions within, or outside of, aircraft 10 such as the main cabin area, cargo hold, and landing gear compartment.

Other examples of sensors and their locations include engine speed sensor 32, wing flap position sensor 34, aileron position sensor 36, and rudder position sensor 38. Sensors 32-38 can be connected to flight data acquisition unit 24 through a main fly-by-wire data bus 40 or wireless channel. Although microphone 28 and camera 30 are shown as being directly connected to flight recorder 26, each can be connected to flight recorder 26 via data bus 40 or by wireless transmission.

Figure 2:
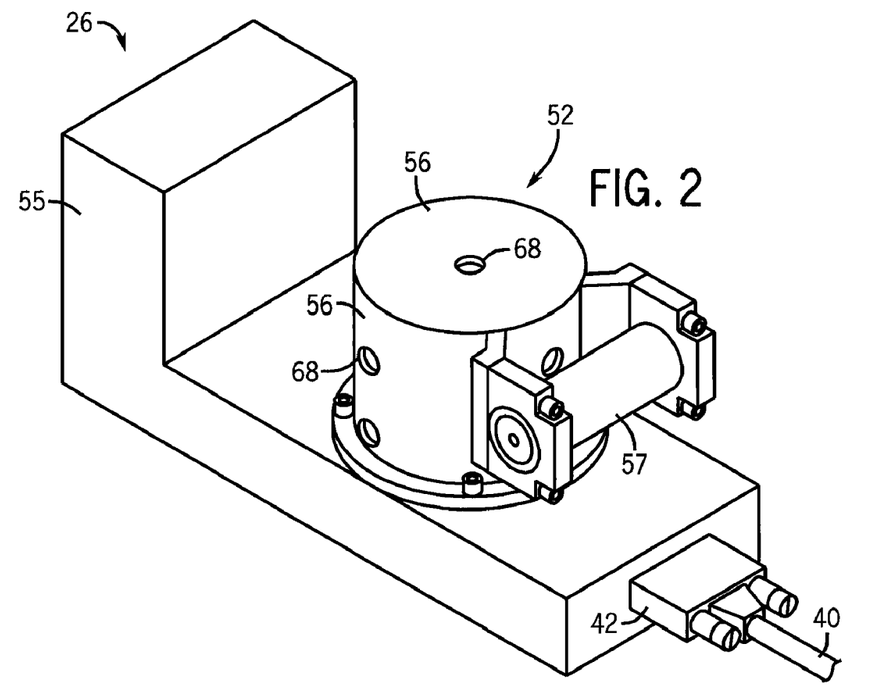
FIG. 2 shows further detail of the flight recorder of FIG. 1.
Figure 3:
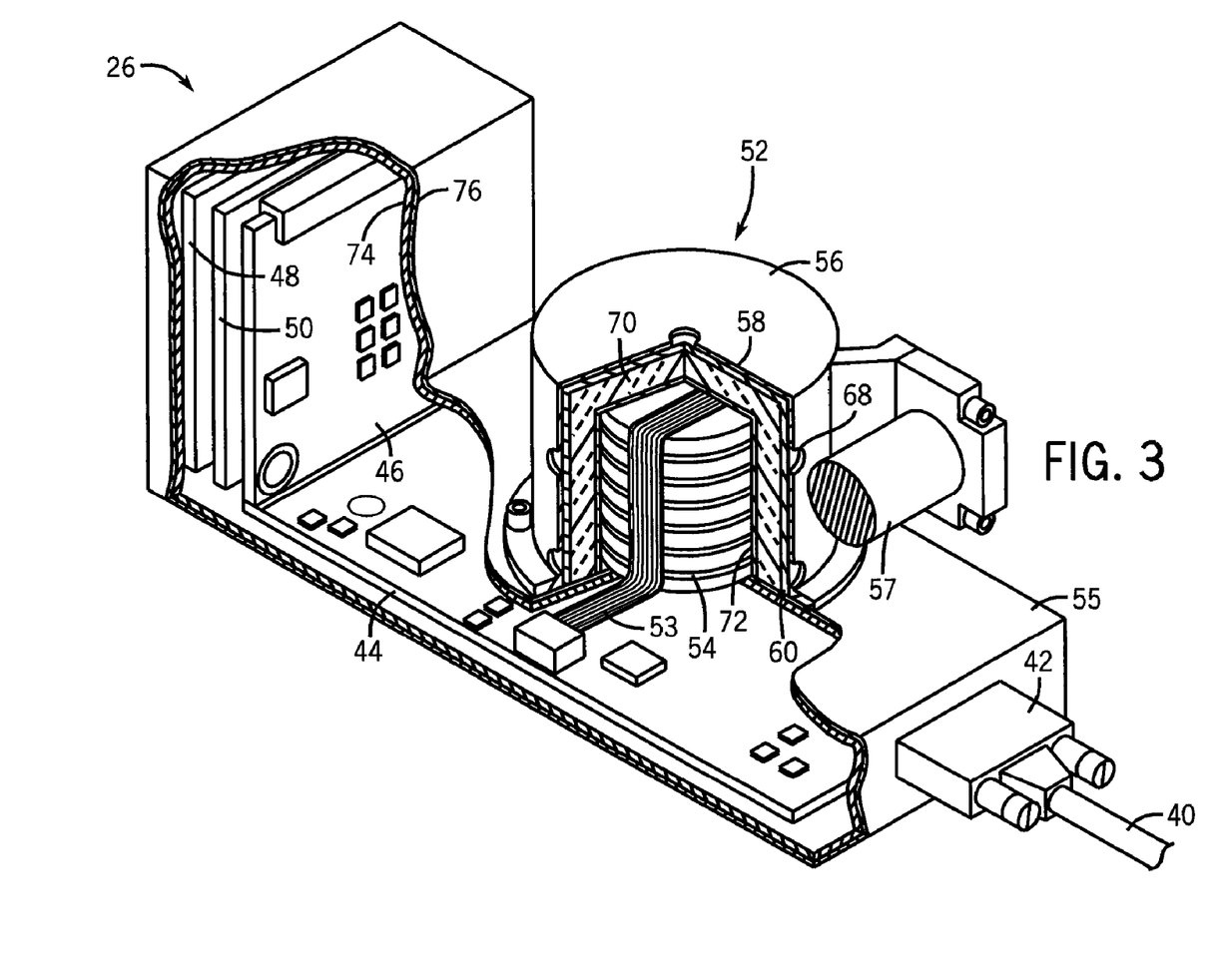
FIG. 3 is a cut-away view of the flight recorder of FIG. 2.

Referring now to FIGS. 2 and 3, flight recorder 26 is depicted as a combined flight data recorder, voice recorder, and video recorder. Alternatively, these functions can be separated into three individual units including an individual flight data recorder, individual voice recorder, individual video recorder, or other combinations such as a joint flight data and voice recorder and individual video recorder. Flight recorder 26 can include an information input device such as connector 42 which receives information from any of the aforementioned sensors, microphone 28, camera 30, flight data acquisition unit 24, and data bus 40. Connector 42 can be connected to acquisition processor board 44, which can be connected to audio compression board 46, video compression board 48, and aircraft interface board 50. A crash survivable memory unit (CSMU) 52 is connected to boards 44, 46, and 48 via memory interface cable 53. Flight recorder 26 can further include board housing 55, and an underwater beacon 57, or other beacon, to aid in the retrieval of flight recorder 26 in the event of a crash or other calamity.

CSMU 52 includes at least one heat sensitive memory device which can be in the form of non-volatile memory unit 54 which retains the flight information stored therein in the event of a crash or other loss of power event. Non-volatile memory unit 54 is depicted as a stack of memory cards having computer memory chips thereon; however, non-volatile memory unit 54 can include other memory technologies such as magnetic hard drive, CD, or DVD, as well as other memory technologies. CSMU 52 is electrically connected to information input device 42.

CSMU 52 includes housing 56 at least partially enclosing non-volatile memory unit 54. In one embodiment, housing 56 is made of an outer material 58. An inner material 60 is disposed between housing 56 and non-volatile memory unit 54. Outer material 58 has a higher melting temperature than the inner material 60. For example, inner material 60 can include aluminum such as 7075T6 or 7068T6511 having a 0.050-0.350 inch wall thickness, and more preferably a 0.125-0.250 inch wall thickness. Outer material 58 can include nickel having a 0.001-0.250 inch wall thickness, and more preferably a 0.002-0.010 inch wall thickness. The material and dimensions are selected according to crush resistance requirements and penetration resistance requirements. Further, outer material 58 is not necessarily thinner than inner material 60, as will be described in more detail below relative to the embodiment of FIGS. 5 and 6.

Figure 4:
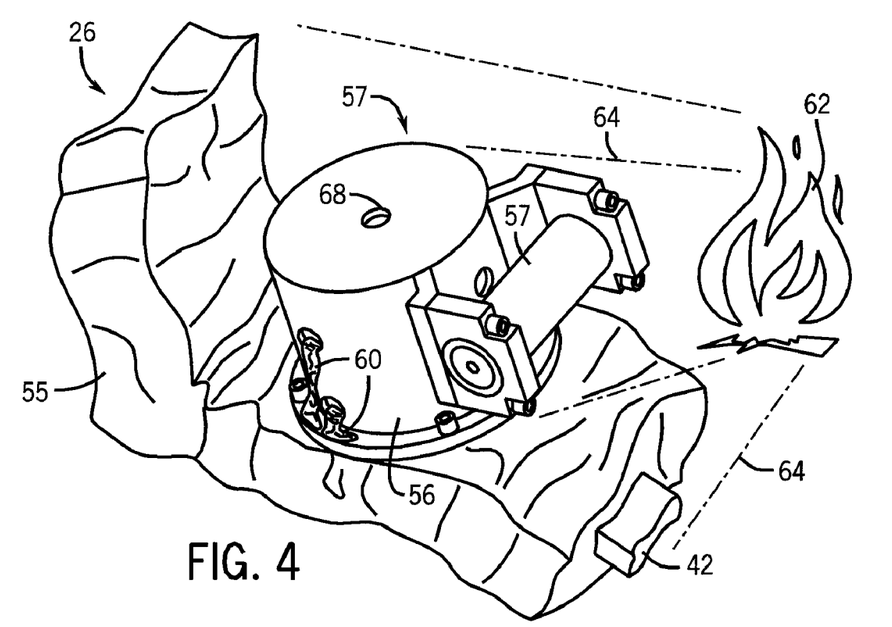
FIG. 4 shows the flight recorder of FIG. 2 following a crash.

As shown in FIG. 4, when flight recorder 26 is exposed to high heat source 62, heat energy 64 is transferred to flight recorder 26 including CSMU 52. As noted above, inner material 60 has a lower melting temperature than outer material 58. When CSMU 52 is exposed to heat energy 64, inner material 60 liquefies or otherwise changes state and egresses out of openings 68 in housing 56. Each opening 68 extends from an outer surface of outer material 58 to inner material 60. This novel construction has the advantage of absorbing heat according to the specific heat of the materials used, and particularly to absorb enough heat by housing 56 to raise the temperature of housing 56 to the melting temperature of inner material 60, and further absorbs heat according to the latent heat of fusion of material 60. Latent heat is the energy released (gas to liquid or liquid to solid) or absorbed (liquid to gas or solid to liquid) during a change of state. In a liquid-gas or gas-liquid transformation the latent heat is referred to as the latent heat of vaporization, and in a solid-liquid transformation the latent heat is referred to as the latent heat of fusion. Thus, inner material 60 is an expendable sacrificial layer which provides additional energy absorption and helps protect non-volatile memory unit 54 from damage from heat source 62, or other sources of heat.

Additionally, when inner material 60 is liquefied and egresses out of openings 68, a void or air gap is formed between outer material 58 and insulating material 70, further reducing at least the conductive and convective heat transfer from heat source 62 to non-volatile memory unit 54, thereby providing even more thermal protection for memory unit 54. High temperature insulating material 70 can be a dry-silica material or other high temperature insulation. In other aspects, CSMU 52 can include an additional memory stack housing 72 which can be made of stainless steel, brass, or aluminum. Further, board housing 55 can include an inner material 74 with a lower melting point than outer material 76 to further thermally protect CSMU 52.

The present invention is not limited to materials which change state from a solid to a liquid at a predetermined temperature. For example, sacrificial materials 60 and 74 can include a material which sublimates (solid to gas transition) at a predetermined temperature. The present invention is also not limited to materials 60 and 74 which change state at a predetermined temperature, but can additionally include materials which change phase and/or composition when absorbing or releasing sufficient energy, or reaching a predetermined temperature.

The present invention is not limited to expendable materials 60 and 74 being on the inside of layers 58 and 76, respectively, but also includes embodiments where expendable materials 60 and 74 are on the outside of layers 58 and 76.

Figure 5:
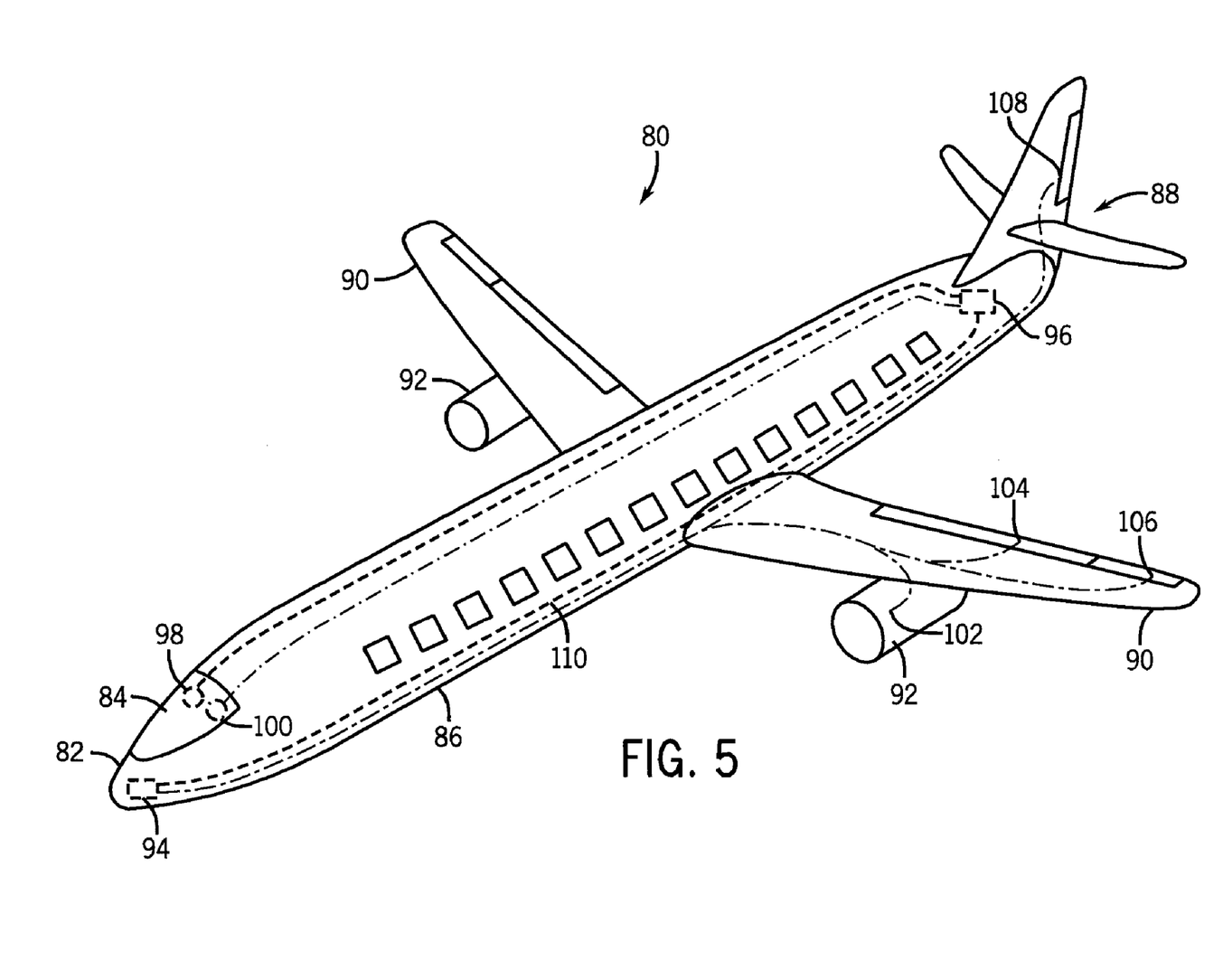
FIG. 5 illustrates another embodiment of an aircraft with a flight recorder having a CSMU.
Figure 6:
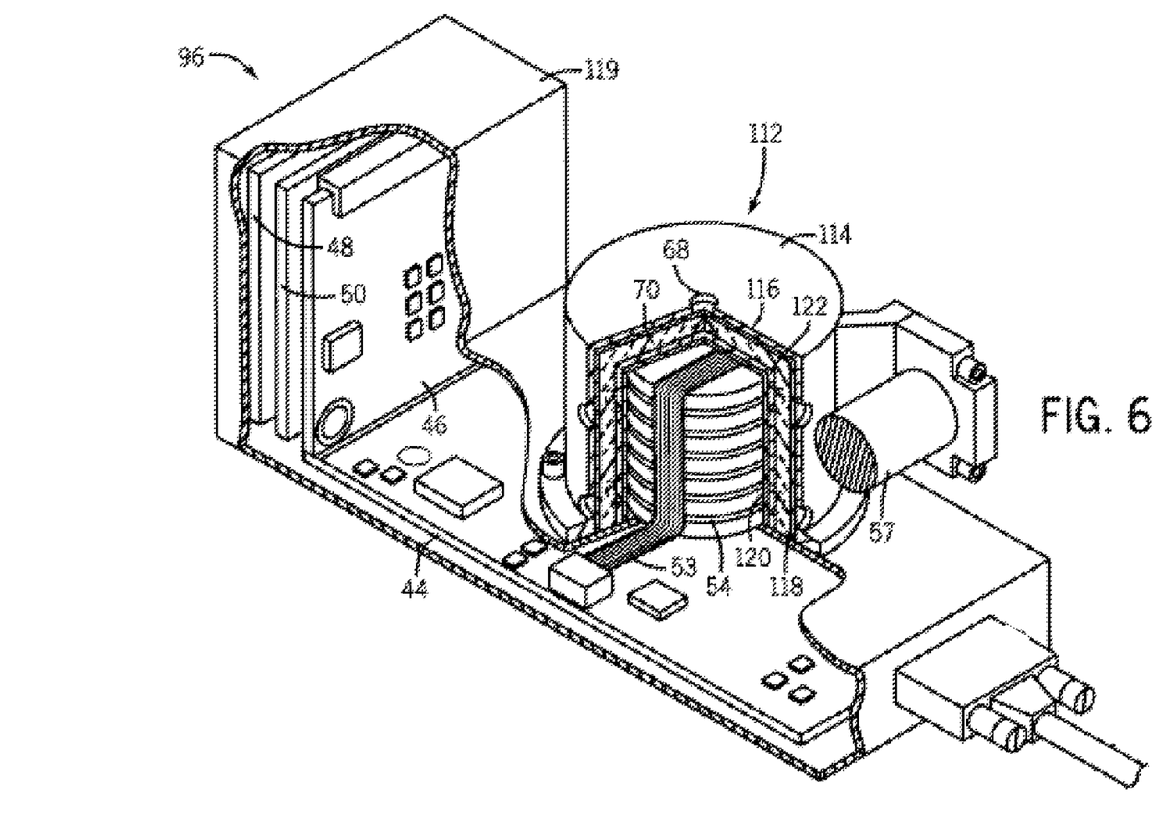
FIG. 6 shows further detail of the flight recorder of FIG. 5.

Whereas the embodiments of FIGS. 1-4 depict a general aviation type aircraft 10, aircraft 80 is more directed towards a commercial aircraft in FIGS. 5 and 6. As was described in more detail for aircraft 10, aircraft 80 can include nose section 82, cockpit 84, fuselage 86, tail section 88, wings 90, and engines 92. Fuselage 86 includes an airframe with many components. A flight data acquisition unit 94, can be positioned in nose 82, or other locations, to acquire various flight information such as air speed, altitude, vertical acceleration, time, magnetic heading, control-column position, rudder-pedal position, control-wheel position, wing flap position, horizontal stabilizer, fuel flow, and landing gear position, from corresponding sensors throughout aircraft 80. Flight data acquisition unit 94 can be connected to flight recorder 96 which is similar to flight recorder 26 previously discussed. Flight recorder 96 can be connected to microphone 98, or other types of sound sensors, for the recording of sound data such as crew and passenger conversations. Similarly, flight recorder 96 can be connected to camera 100, or other types of video sensors, for the recording of video data such as crew and passenger actions. Although microphone 98 and camera 100 are shown as being positioned in cockpit 84, each can be located in a variety of positions within, or outside of, aircraft 80 such as the main cabin area, cargo hold, and landing gear compartment.

Other examples of sensors and their locations include an engine speed sensor 102, wing flap position sensor 104, aileron position sensor 106, and rudder position sensor 108. Sensors 102-108 can be connected to flight data acquisition unit 94 through a main fly-by-wire data bus 110. Although microphone 98 and camera 100 are shown as being directly connected to flight recorder 96, each can be connected to flight recorder 96 via data bus 110, or by wireless communications.

Flight recorder 96 is similar to flight recorder 26 in many ways and is depicted as a combined flight data recorder, voice recorder and video recorder, but alternatively can be individual or other combinations of flight data recorder, voice recorder, and video recorder. Only the primary differences are emphasized in the following discussion. FIG. 6 shows flight recorder 96 which includes CSMU 112. CSMU 112 can include a CSMU housing 114 at least partially enclosing non-volatile memory unit 54. In one embodiment, and because of the crush and penetration resistance requirements for commercial aircraft flight recorders, housing 114 typically has a relatively thick outer material 116 which is made of stainless steel. This can be modified by adding an inner material 118 where inner material 118 is in closer proximity to non-volatile memory unit 54 than the outer material, and outer material 116 has a higher melting temperature than the inner material. Board housing 119 can be single layer as shown, or multilayer as previously described.

Similar to what is shown in FIG. 4 for flight recorder 26, when flight recorder 96 is exposed to high heat source 62, heat energy 64 is transferred to flight recorder 96 including CSMU 112. As noted above, inner material 118 has a lower melting temperature than outer material 116. When CSMU 112 is exposed to heat energy 64, inner material 118 liquefies and egresses out of openings 68 in housing 114. Each opening 68 extends from an outer surface of outer material 116 to inner material 118. The inner material 118 is an expendable sacrificial layer which provides additional energy absorption and protect non-volatile memory unit 54 from damage from heat source 62. Inside housing 120 can also be plated with an expendable sacrificial material 122 disposed between heat insulating layer 70 and memory unit 54. The sacrificial material 122 has a lower melting temperature than housing 114. Further, materials 116, 118, 120, and 122 can have the alternative forms and relationships which have been previously described for materials 58, 60, 74 and 76 and housing 72.

As is apparent, the present invention can also be adapted to helicopters, propeller driven aircraft, experimental aircraft, drones, ultra-light aircraft, blimps, balloons, military aircraft, and flying wings.

Figure 7:
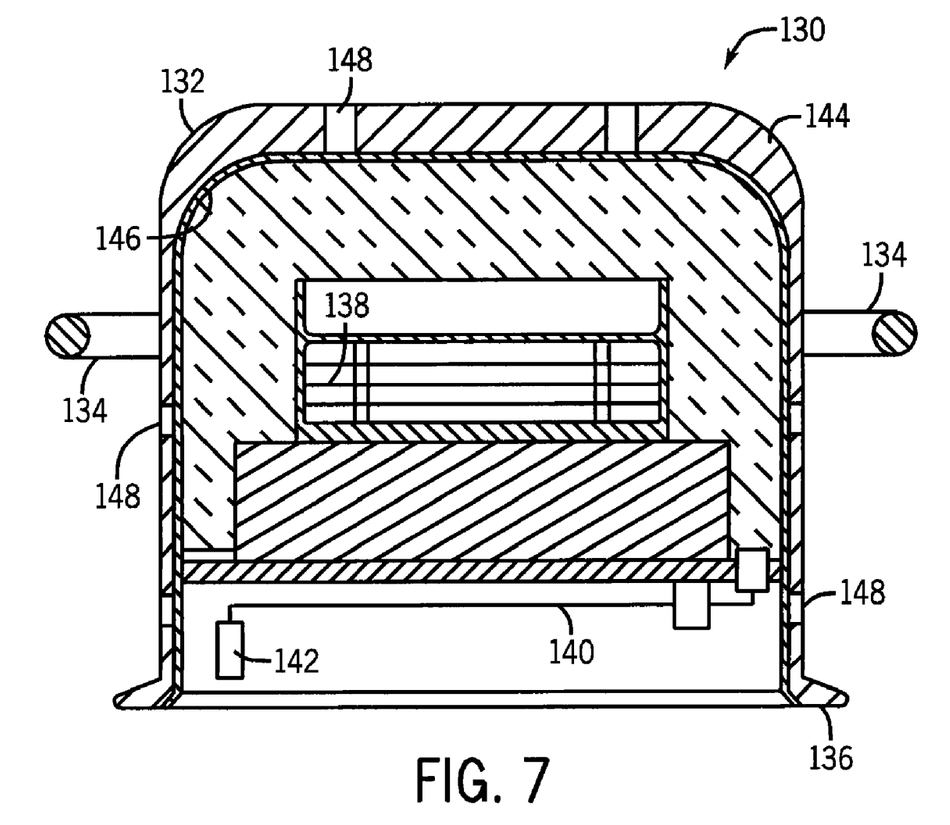
FIG. 7 illustrates a CSMU in a marine hardened voyage data recorder.

The embodiment of FIG. 7 particularly illustrates how the present invention can be adapted to other transportation systems. FIG. 7 illustrates a marine environment hardened voyage data recorder CSMU 130 which connects to shipboard data acquisition devices, and which is a modification of the recorder described in U.S. Pat. No. 7,208,685, incorporated herein by reference. CSMU 130 includes housing 132, lifting handles 134, flange 136 which is used to provide a sealing engagement with the subassembly 12 of the U.S. Pat. No. 7,208,685 as seen best in FIGS. 2 and 8, non-volatile memory unit 138 which is protected in boiler 132 (similar to that disclosed in U.S. Patent Application Publication No. 20020144834, incorporated herein by reference), and ribbon cable 140 which is connected to non-volatile memory unit 138 and having a connector 142 for connection to the shipboard data acquisition devices. The material 144 of housing 132 can have a higher melting temperature than expendable material 146, which can flow through openings 148 in housing 132 when CSMU 130 is exposed to a source of high heat, similar to CSMUs 52 and 96. Further, materials 144 and 146 can have the alternative forms and relationships which have been previously described for materials 58, 60, 74, 76 and housing 72, and materials 116, 118, 120, and 122.

CSMU can be adapted to a variety of marine transportation systems such as boats, submarines, hovercraft, also spanning to pleasure/recreational, scientific, commercial, military, land-based vehicles, and space travel.

While one or more embodiments of the present invention have been illustrated in detail, the skilled artisan will appreciate that modifications and adaptations to those embodiments may be made without departing from the scope of the present invention as set forth in the following claims.

What is claimed is:

1. A crash survivable memory unit, comprising:
   a heat sensitive memory device;

a housing enclosing the heat sensitive memory device, the housing being made with a first material and having a plurality of openings made through the housing;

a heat insulating layer comprising a second material and disposed between the housing and the heat sensitive memory device; and a sacrificial material disposed between the housing and the heat insulating layer, the sacrificial material having a lower melting temperature than the first material and the second material such that the sacrificial material changes state and egresses through the openings in the housing when exposed to heat to create an air gap between the housing and the heat insulating layer.

2. The crash survivable memory unit of claim 1, wherein the heat sensitive memory device is a non-volatile memory unit.

3. The crash survivable memory unit of claim 1, further including a second sacrificial material disposed between the heat insulating layer and heat sensitive memory device.

4. The crash survivable memory unit of claim 1, wherein the first material includes nickel and the sacrificial material includes aluminum.

5. A flight recorder, comprising:
an information input device;
a heat sensitive memory device electrically connected to the information input device;
a housing enclosing the heat sensitive memory device, the housing being made with a first material and having a plurality of openings made through the housing;
a heat insulating layer comprising a second material and disposed between the housing and the heat sensitive memory device; and
a sacrificial material disposed between the housing and the heat insulating layer, the sacrificial material having a lower melting temperature than the first material and the second material such that the sacrificial material changes state and egresses through the openings in the housing when exposed to heat to create an air gap between the housing and the heat insulating layer.

6. The flight recorder of claim 5, wherein the heat sensitive memory device is a non-volatile memory unit.

7. The flight recorder of claim 5, further including a second sacrificial material disposed between the heat insulating layer and heat sensitive memory device.

8. The flight recorder of claim 5, wherein the first material includes nickel and the sacrificial material includes aluminum.

9. The flight recorder of claim 5, wherein the flight recorder is selected from the group consisting of a flight data recorder, flight voice recorder, and flight video recorder.

10. An aircraft, comprising:
an airframe; and
a flight recorder connected to the airframe, the flight recorder including,
(a) an information input device,
(b) a heat sensitive memory device electrically connected to the information input device,
(c) a housing enclosing the heat sensitive memory device, the housing being made with a first material and having a plurality of openings made through the housing,
(d) a heat insulating layer comprising a second material and disposed between said housing and said heat sensitive memory device; and
(e) a sacrificial material disposed between the housing and the heat insulating layer, the sacrificial material having a lower melting temperature than the first material and the second material such that the sacrificial material changes state and egresses through the openings in the housing when exposed to heat to create an air gap between the housing and the heat insulating layer.

11. The aircraft of claim 10, wherein the heat sensitive memory device is a non-volatile memory unit.

12. The aircraft of claim 10, further including a second sacrificial material disposed between the heat insulating layer and heat sensitive memory device.

13. The aircraft of claim 10, wherein the first material includes nickel and the sacrificial material includes aluminum.

14. The aircraft of claim 10, wherein the flight recorder is selected from the group consisting of a flight data recorder, flight voice recorder, and flight video recorder.

15. A method of making a crash survivable memory unit, comprising:
providing a heat sensitive memory device;
enclosing the heat sensitive memory device in a housing, the housing being made with a first material and having a plurality of openings made through the housing;
disposing a heat insulating layer between said housing and said heat sensitive memory device, said heat insulating layer comprising a second material; and
disposing a sacrificial material between the housing and the heat insulating layer, the sacrificial material having a lower melting temperature than the first material and the second material such that the sacrificial material changes state and egresses through the openings in the housing when exposed to heat to create an air gap between the housing and the heat insulating material.

16. The method of claim 15, wherein the heat sensitive memory device is a non-volatile memory unit.

17. The method of claim 15, further including disposing a second sacrificial material between the heat insulating layer and heat sensitive memory device.

18. The method of claim 15, wherein the first material includes nickel and the sacrificial material includes aluminum.

* * * * *